United States Patent [19]
Nakagawa et al.

[11] Patent Number: 5,523,592
[45] Date of Patent: Jun. 4, 1996

[54] SEMICONDUCTOR OPTICAL DEVICE, MANUFACTURING METHOD FOR THE SAME, AND OPTO-ELECTRONIC INTEGRATED CIRCUIT USING THE SAME

[75] Inventors: Kiyokazu Nakagawa, Sayama; Akio Nishida, Misato; Toshikazu Shimada, Kokubunji, all of Japan

[73] Assignee: Hitachi, Ltd., Tokyo, Japan

[21] Appl. No.: 189,865

[22] Filed: Feb. 1, 1994

[30] Foreign Application Priority Data

Feb. 3, 1993 [JP] Japan .................... 5-016524
Mar. 1, 1993 [JP] Japan .................... 5-039631

[51] Int. Cl.$^6$ .................. H01L 33/00; H01L 31/0312; H01S 3/19
[52] U.S. Cl. .................. 257/96; 257/19; 257/13; 257/85; 257/97; 372/45
[58] Field of Search .................. 257/13, 19, 18, 257/85, 55, 63, 96, 97; 372/45

[56] References Cited

U.S. PATENT DOCUMENTS

| | | | |
|---|---|---|---|
| 4,527,179 | 7/1985 | Yamazaki | 257/13 |
| 4,772,924 | 9/1988 | Bean et al. | 257/19 |
| 4,843,028 | 6/1989 | Herzog et al. | 257/19 |
| 4,927,471 | 5/1990 | Okuda | 257/18 |
| 5,014,096 | 5/1991 | Matsuda et al. | 257/85 |
| 5,057,880 | 10/1991 | Eshita et al. | 257/18 |
| 5,272,548 | 12/1993 | Kawai et al. | 358/482 |

FOREIGN PATENT DOCUMENTS 63-108782  5/1988  Japan .................... 257/13

OTHER PUBLICATIONS

Mi, et al *IEEE Trans. on Elec. Dev.*, vol. 39 No. 11 Nov. 92, "Room–Temp. on Si/Si$_{1-x}$Ge$_x$ Quantum Wells".
Physical Review Letters, vol. 66, No. 10, "Well–Resolved Band–Edge Photoluminescence of Excitons Confined in Strained Si$_{1-x}$Ge$_x$ Quantum Wells", J. C. Sturm, et al.
Appl. Phys. Lett. 60 (14). Apr. 6, 1992, "Photoluminescence from electron–hole plasmas confined in Si/Si$_{1-x}$Ge$_x$/Si quantum wells", Xiao, C. W. Liu, et al.

*Primary Examiner*—Jerome Jackson, Jr.
*Attorney, Agent, or Firm*—Kenyon & Kenyon

[57] ABSTRACT

By i) forming a layered structure of an undoped single crystalline Si layer and single crystalline Si$_{0.8}$Ge$_{0.2}$ mixed crystal layer on an n-Si(100) substrate, a second undoped single crystalline Si layer on it, and a p type hydrogenated amorphous Si$_{1-B}$C$_B$ layer on it, iii) mounting an n-Si$_{0.55}$Ge$_{0.40}$C$_{0.05}$ layer on an n-Si(100) substrate and forming a layered structure of an undoped single crystalline Si$_{0.55}$Ge$_{0.40}$C$_{0.05}$ layer and Si$_{0.8}$Ge$_{0.2}$ layer, an undoped single crystalline Si$_{0.55}$Ge$_{0.40}$C$_{0.05}$ layer, and a p-Si$_{0.55}$Ge$_{0.40}$C$_{0.05}$ layer sequentially on it or iv) mounting an n type single crystalline Si layer on an n-Si(100) substrate and forming a layered structure of an undoped single crystalline Si layer and Si$_{0.8}$Ge$_{0.1}$Sn$_{0.1}$ layer, an undoped single crystalline Si layer, and a p type single crystalline Si layer sequentially on it, a semiconductor optical device is obtained.

24 Claims, 7 Drawing Sheets

SEMICONDUCTOR OPTICAL DEVICE, MANUFACTURING METHOD FOR THE SAME, AND OPTO-ELECTRONIC INTEGRATED CIRCUIT USING THE SAME

BACKGROUND OF THE INVENTION

The present invention relates to a semiconductor optical device using a mixed crystal consisting of IV-group semiconductors, a manufacturing method for it, and an opto-electronic integrated circuit using it.

IV-group semiconductors such as Si and Ge are indirect transition type semiconductors. Therefore, they have a very low light emitting efficiency and are not suited for use in light emitting devices. However, it has been found recently that a mixed crystal of SiGe emits light strongly by photoluminescence though at a low temperature. Since it was announced in J. C. Sturm et al; Physical Review Letters, Vol. 66 (1991), pp. 1362– 1365, a light emitting device using SiGe has been studied enthusiastically.

A light emitting device has a layered structure where Si and a mixed crystal of SiGe are put on top of each other and a layer of Si is placed on the top. The mixed crystal of SiGe is a light emitting region. Light emission occurs because Ge atoms in the SiGe crystal occupy crystal lattice sites of Si at random, so that the translation symmetry of the Si crystal is lost and the band structure is changed.

According to the above prior art, the band discontinuity of the conduction band between the Si barrier layer for confining carriers and the SiGe well layer is extremely low such as about 20 meV and electrons cannot be confined effectively at room temperature, so that devices which operate efficiently at room temperature cannot be formed, Furthermore, a method to manufacture light emitting and sensing devices constructed from IV-group semiconductors such as Si and Ge is also discussed in X. Xiano et al; Applied Physics Letters, Vol. 60, Number 14 (1992), pp. 1720–1722.

According to X. Xiano et al, a light emitting phenomenon caused by recombination of electrons and holes which are confined in the quantum well $Si_{1-w}Ge_w$ (w=0.2) having the $Si/Si_{1-w}Ge_w$ (w=0.2)/Si structure is observed. However, the band discontinuity of the conduction band between Si and $Si_{1-w}Ge_w$ (w=0.2) is extremely low, about 20 meV as mentioned above, and electrons cannot be confined in the quantum well at room temperature: photoluminescence can be observed from the quantum well only at a low temperature such as about 77K.

In the case of the structure of X. Xiano et al, it is considered to decrease the band gap (forbidden band width) and increase the band discontinuity by increasing the w value of $Si_{1-w}Ge_w$. However, in this structure, as the band gap decreases, only the band discontinuity of the valence band increases but the band discontinuity of the conduction band does not increase. Therefore, although holes can be confined in the $Si_{1-w}Ge_w$ layer, electrons cannot be confined at room temperature and efficient light emission at room temperature is not reported.

On the other hand, in a conventional opto-electronic integrated circuit, light emitting devices are made of III-V compound semiconductors and electronic elements are made of Si. Therefore, it is difficult to form light emitting devices and electronic elements in a chip.

SUMMARY OF THE INVENTION

Objects of the present invention are to eliminate the difficulties of the prior art mentioned above and to provide a semiconductor optical device having a structure using a mixed crystal of IV-group semiconductors. The structure can confine carriers effectively in the quantum well or light emitting layer and the device can operate efficiently at room temperature. The other objects of the present invention are to provide a manufacturing method for the above mentioned device and an opto-electronic integrated circuit using it.

To accomplish the above object, the semiconductor optical device of the present invention has a structure as described hereunder.

i) The first semiconductor optical device of the present invention has a pn junction diode structure consisting of a first conductive type single crystalline Si substrate, a first conductive type $Si_{1-X}Ge_X$ buffer layer (0<X<0.5) which is mounted on the Si substrate, a layered structure of an $Si_{1-Y}Ge_Y$ layer and $Si_{1-Z}Ge_Z$ layer (0<Y<0.5, 0<Z<0.5, Y<X and Y<Z) which are mounted on the buffer layer so as to be lattice-matched with the buffer layer, and a second conductive type (opposite to the first conductive type) $Si_{1-Y}Ge_Y$ layer which is mounted on the layered structure. By applying a voltage and supplying a current to the semiconductor optical device in the forward direction of the diode structure, a semiconductor optical device which emits light by recombining holes and electrons in the multilayer film consisting of the $Si_{1-Y}Ge_Y$ layer and $Si_{1-Z}Ge_Z$ layer can be operated. Also a light sensing device can be obtained in the same structure.

The above layered structure consists of $Si_{1-Y}Ge_Y$ layers and $Si_{1-Z}Ge_Z$ layers which are alternately stacked. The thickness of each layer is between 2 nm and 10 nm, more desirably between 5 nm and 10 nm. To allow the layered structure to have a superlattice band and for carriers in a well to move to the next well by tunnelling effect, the thickness of each layer of the layered structure is preferably 10 nm or less. Furthermore, using the current technique to control the forming of each thin layer, it is necessary to increase the film thickness to at least 2 nm, more desirably to at least 5 nm.

The thickness of the buffer layer is at least the critical film thickness. In the case where the film thickness exceeds the critical thickness, misfit dislocations are introduced at the interface between the substrate and the film. When the buffer layer is undoped, it operates as a series resistor when the device is in operation. Therefore, the upper limit of the thickness of the undoped buffer layer is decided so that the resistance does not exceed the design value. When the buffer layer is doped, there is no need to consider the resistance particularly. Regardless of doping and undoping, thick buffer layers need long deposition time (the general deposition rate is 1 µm per 3 hours). A thickness slightly thicker than the critical thickness is practical.

The thickness of the above second conductive type $Si_{1-Y}Ge_Y$ layer is at least 50 nm. When the thickness is less than 50 nm, reaction between the layer and an electrode metal such as Al deposited on the layer may reach the lower layer of $Si_{1-Z}Ge_Z$ undesirably. There is no upper limit on the thickness of the second conductivity type layer. However, when the layer is too thick, the time required for deposition is prolonged. Therefore, it is not advisable to make the layer thick unnecessarily.

As mentioned above, the layered structure consists of at least one pair of an $Si_{1-Y}Ge_Y$ layer and $Si_{1-Z}Ge_Z$ layer. Up to 20 pairs are available in consideration of the forming time of a layered structure. When the number of pairs is increased, the light emitting area of the device is increased and the light emitting efficiency is increased.

ii) The second semiconductor optical device of the present invention has a structure consisting of a first conductive type single crystalline Si substrate, a layered structure of a first undoped single crystalline Si layer and a single crystalline $Si_{1-A}Ge_A$ mixed crystal layer ($0<A<1$) mounted on the single crystalline Si substrate, a second undoped single crystalline Si layer mounted on the layered structure, and a second conductive type (opposite to the first conductive type) $Si_{1-B}C_B$ layer ($0 \leq B<1$) mounted on the second undoped single crystalline Si layer. The single crystalline $Si_{1-A}Ge_A$ mixed crystal layer is a light emitting region. One of the first conductive type single crystalline Si substrate and second conductive type $Si_{1-B}C_B$ layer is an electron injection electrode and the other is a hole injection electrode.

iii) The third semiconductor optical device of the present invention has a structure consisting of a first conductive type single crystalline $Si_{1-C-D}Ge_CC_D$ mixed crystal layer ($0<C<1$, $0<D<1$), a layered structure of a first undoped single crystalline $Si_{1-E-F}Ge_EC_F$ mixed crystal layer ($0<E<1$, $0<F<1$) and a single crystalline $Si_{1-G}Ge_G$ mixed crystal layer ($0<G<1$) mounted on the single crystalline $Si_{1-C-D}Ge_CC_D$ mixed crystal layer, a second undoped single crystalline $Si_{1-E-F}Ge_EC_F$ mixed crystal layer mounted on the layered structure, and a second conductive type (opposite to the first conductive type) single crystalline $Si_{1-H-I}Ge_HC_I$ mixed crystal layer ($0 \leq H<1$, $0<I<1$) mounted on the second undoped single crystalline $Si_{1-E-F}Ge_EC_F$ mixed crystal layer. The single crystalline $Si_{1-G}Ge_G$ mixed crystal layer is a light emitting region. One of the first conductive type single crystalline $Si_{1-C-D}Ge_CC_D$ mixed crystal layer and second conductive type single crystalline $Si_{1-H-I}Ge_HC_I$ mixed crystal layer is an electron injection electrode and the other is a hole injection electrode.

iv) The fourth semiconductor optical device of the present invention has a structure consisting of a first conductive type single crystalline $Si_{1-J}Ge_J$ mixed crystal layer ($0 \leq J<1$), a layered structure of a first undoped single crystalline $Si_{1-K}Ge_K$ mixed crystal layer ($0 \leq K<1$) and a single crystalline $Si_{1-L-M}Ge_LSn_M$ mixed crystal layer ($0<L<1$, $0<M<1$) mounted on the single crystalline $Si_{1-J}Ge_J$ mixed crystal layer, a second undoped single crystalline $Si_{1-K}Ge_K$ mixed crystal layer mounted on the layered structure, and a second conductive type (opposite to the first conductive type) single crystalline $Si_{1-N}Ge_N$ mixed crystal layer ($0 \leq N<1$) mounted on the second undoped single crystalline $Si_{1-K}Ge_K$ mixed crystal layer. The single crystalline $Si_{1-L-M}Ge_LSn_M$ mixed crystal layer is a light emitting region. One of the first conductive type single crystalline $Si_{1-J}Ge_J$ mixed crystal layer and second conductive type single crystalline $Si_{1-N}Ge_N$ mixed crystal layer is an electron injection electrode and the other is a hole injection electrode.

In the first conductive type single crystalline Si substrate of the above mentioned second semiconductor optical device, the single crystalline Si substrate itself may be of the first conductive type or a first conductive type Si layer may be formed on the single crystalline Si substrate.

In any one of the above mentioned second to fourth semiconductor optical devices, the thickness of the light emitting region layer is between 2 nm and 20 nm, more desirably between 5 nm and 20 nm. The thicknesses of the other layers of the layered structure are between 2 nm and 10 nm, more desirably between 5 nm and 10 nm. To allow the layered structure to have a superlattice band and to allow carriers to tunnel, the thicknesses of each layer is preferably thinner than 10 nm. In the same way as with the above mentioned first semiconductor optical device, also in the second to fourth semiconductor optical devices, the thickness of each layer of the layered structure is thicker than 2 nm, more desirably thicker than 5 nm. This is because it is very difficult to form thin films with the thickness of 2 nm.

The thickness of the second undoped single crystalline layer of the above mentioned second to fourth semiconductor optical devices is between 2 nm and 100 nm, more desirably between 5 nm and 100 nm. When the thickness is less than 2 nm, it is difficult to control the film thickness. When the thickness is more than 100 nm, the series resistance of the device during operation is undesirably increased. The thickness of the second conductive type semiconductor layer of the above mentioned second to fourth semiconductor optical devices is at least 50 nm. When the thickness is less than 50 nm, a reacted region formed by reaction of a deposited electrode metal may reach the lower layer undesirably. There is no upper limit of the thickness of the second conductivity type semiconductor layer. However, when the layer is too thick, the time required for deposition is prolonged. Therefore, it is not advisable to make the layer thick unnecessarily.

The layered structure of the above mentioned second to fourth semiconductor optical devices consists of at least one pair of two layers of different compositions; a stack of such a pair may be repeated until strain energy exceeds the critical energy which determines the critical thickness. Therefore, although the desirable number of repetitions varies with the composition and thickness of the light emitting region layer, 20 repetitions are generally available in consideration of manufacturing difficulties. When the number of repetitions is increased, the light emitting area of the device is increased and the light emitting efficiency is increased.

In the above mentioned first to fourth semiconductor optical devices, the carrier densities of the first conductive type semiconductor layer, the second conductive type semiconductor layer and the doped buffer layer may be similar to those of a conventional light emitting devices.

The opto-electronic integrated circuit of the present invention has each light emitting device mentioned above. Electronic elements are formed on the substrate on which the light emitting device is mounted. Desirable opto-electronic integrated circuit consists of one of the above light emitting devices and a light sensing device which has the same structure as the light emitting device, where an electron take-out electrode which corresponds to the electron injection electrode of light emitting device, and a hole take-out electrode corresponds to the hole injection electrode of light emitting device. Therefore, the electronic elements connected to these optical devices are mounted on the same substrate, and the light emitting surface of the light emitting device and the light sensing surface of the light sensing device are arranged opposite to each other.

Next, the operation of each semiconductor optical device of the present invention will be explained.

As shown in FIG. 1, the first semiconductor optical device of the present invention has many misfit dislocations on the interface between the $Si_{1-x}Ge_x$ buffer layer which grows more than the critical film thickness and the Si substrate. Therefore, the lattice constant of the $Si_{1-x}Ge_x$ mixed crystal is described in a composition ratio X unlike so-called lattice-matching and can be written as "lattice constant of $Si_{1-x}Ge_x$=(lattice constant of Si)× (1−x)+(lattice constant of Ge)×X." According to the present invention, a multilayer film (i.e., layered structure) of $Si_{1-Y}Ge_Y/Si_{1-Z}Ge_Z/Si_{1-Y}Ge_Y/Si_{1-Z}Ge_Z$— (repeated) is grown by lattice-matching. By changing the composition ratio X, an tensile stress can be controlled and applied to the SiGe mixed crystal layer with less Ge concentration than that of the buffer layer. In this case, the energy band of the multilayer is as shown in FIG. 2, and even at room temperature, electrons can be accumulated on the $Si_{1-Y}Ge_Y$ layer and holes on the $Si_{1-Z}Ge_Z$ layer. Furthermore, the $Si_{1-Y}Ge_Y$ layer where electrons are accumulated is a mixed crystal of Si and Ge, so that the periodicity of the crystal is disturbed by the existence of Ge atoms and the multilayer behaves as a quasi-direct transition type semiconductor. When a voltage is applied to this multilayer film so as to inject holes and electrons, the multilayer emits light efficiently at room temperature as shown in FIG. 3.

The operations of the second, third, and fourth semiconductor optical devices of the present invention will be explained hereunder. In this case, n type is a first conductive type and the p type is a second conductive type.

In the second semiconductor optical device of the present invention, the single crystalline $Si_{1-A}Ge_A$ mixed crystal layer of the layered structure is a light emitting region by the mixed crystal effect. However, since the band discontinuity of the conduction band is small, almost all of the electrons injected from the electrode are not combined with holes in the light emitting region and reach the electrode of the p-$Si_{1-B}C_B$ layer. However, since the p-$Si_{1-B}C_B$ layer forms a potential barrier for electrons at the conduction band, the electrons are repelled into the light emitting region and combined with the holes confined in the light emitting region so as to emit light effectively.

In the third semiconductor optical device of the present invention, the single crystalline $Si_{1-G}Ge_G$ mixed crystal layer of the layered structure is the light emitting region. To effectively confine electrons and holes in the light emitting region, the device is structured so that the light emitting region is put between SiGeC mixed crystal layers with a large band gap. By doing this, light is emitted effectively.

In the fourth semiconductor optical device of the present invention, the single crystalline $Si_{1-L-M}Ge_LSn_M$ mixed crystal layer of the layered structure is a light emitting region. In this case, a semiconductor having a small band gap is a light emitting region using an SiGeSn mixed crystal, so that electrons and holes can be confined effectively in this region so as to emit light efficiently, Furthermore, since the semiconductor optical device of the present invention consists of the Si system (this term means Si or mixed crystal composed of IV-group semiconductors, in the present specification) semiconductor, each semiconductor optical device of the present invention mentioned above can be formed on the Si substrate. Therefore, Si electronic elements, and light emitting and sensing devices can be formed on the same Si substrate.

The semiconductor optical devices of the present invention mentioned above can be applied to light emitting diodes and laser diodes.

The semiconductor optical devices of the present invention mentioned above can be manufactured by cleaning the surface of an Si substrate and forming films having a predetermined composition, thickness, and shape sequentially by using the well-known film forming method such as the molecular beam epitaxy method, chemical vapor deposition method and the photolithography method.

DETAILED DESCRIPTION

Next, the embodiments of the present invention will be explained with reference to the accompanying drawings.

Embodiment 1

FIGS. 4a, 4b, 4c, and 4d are schematic cross sectional views showing the manufacturing process of the first semiconductor optical device of the present invention in this embodiment.

As is generally known, a thin oxide film is formed on the surface of an n-Si(100) substrate 11 by chemical processing and the surface is cleaned by heating the oxide film at about 800° C. under ultrahigh vacuum in a molecular beam epitaxy chamber so as to sublimate the oxide film. Also in the second and subsequent embodiments, each Si substrate is cleaned in the same way.

Figure 1:
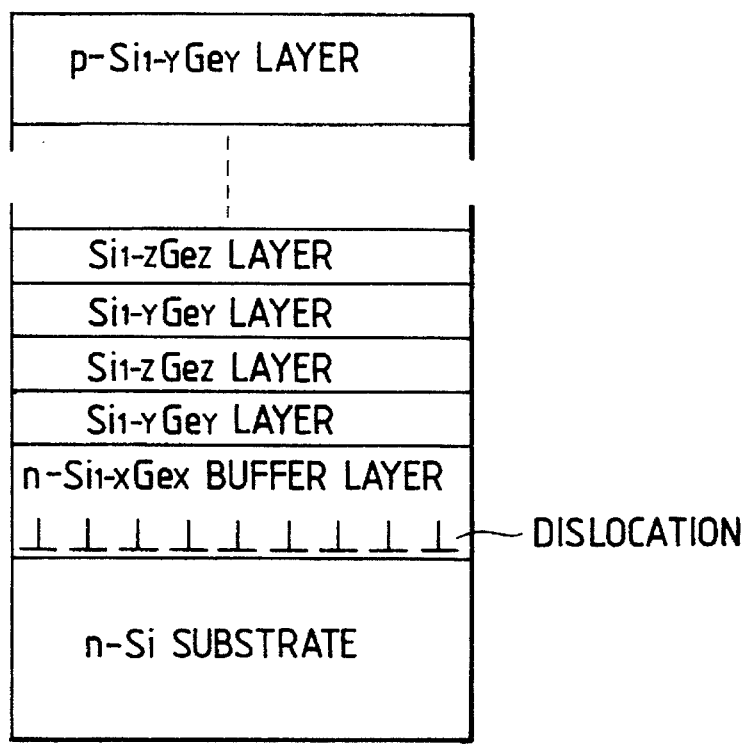
FIG. 1 is a schematic cross sectional view showing the structure of a semiconductor multilayer film constituting the first semiconductor optical device of the present invention.
Figure 2:
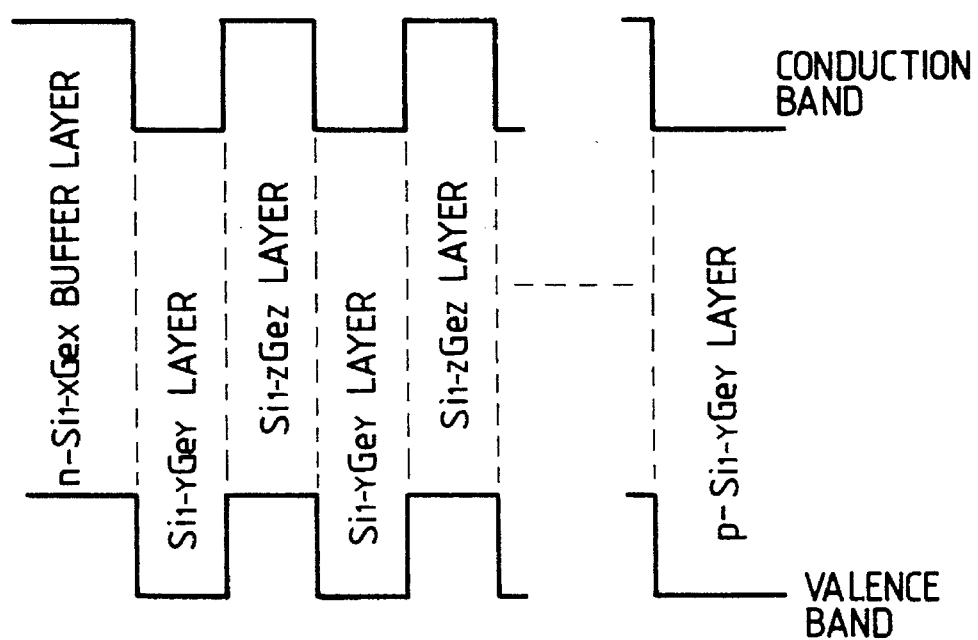
FIG. 2 is a diagram showing the schematic energy band structure of a semiconductor multilayer film constituting the first semiconductor optical device of the present invention.
Figure 3:
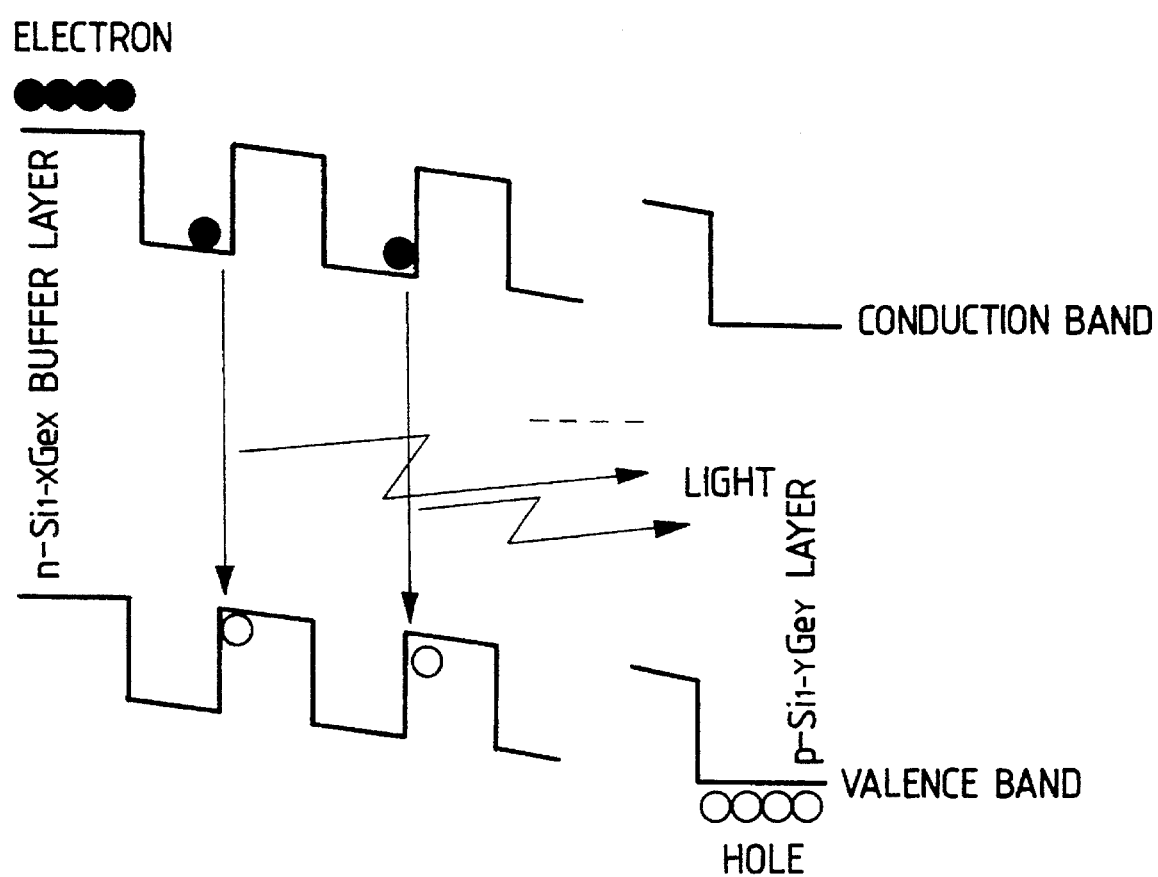
FIG. 3 is a diagram showing the schematic energy band structure for explaining the operating principles of the first semiconductor optical device of the present invention.
Figure 4A:
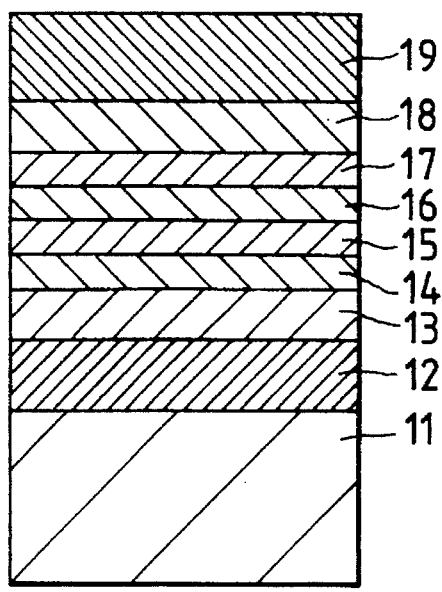
FIGS. 4a, 4b, 4c, and 4d are schematic cross sectional views showing the manufacturing process of the first semiconductor optical device of the present invention in an embodiment of the present invention.
Figure 4B:
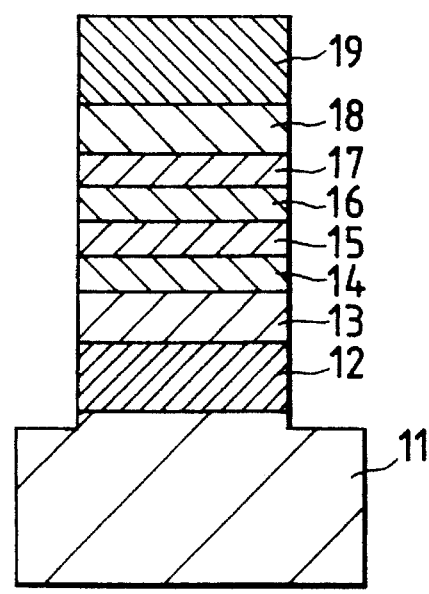
Figure 4C:
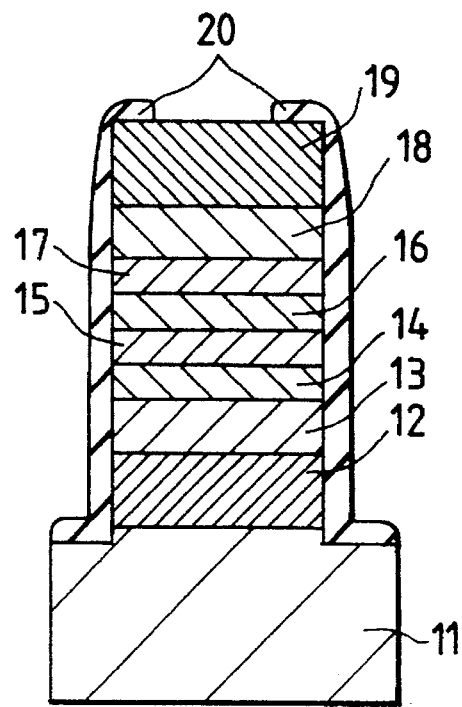
Figure 4D:
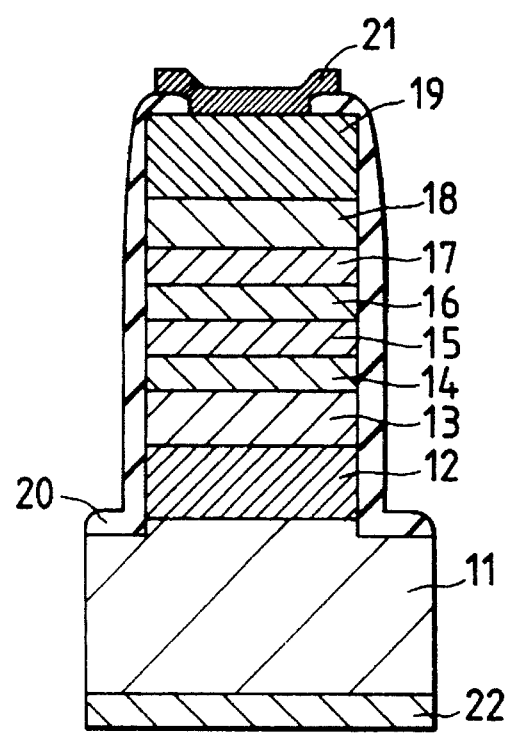

On the substrate, Si, Ge, and n type dopant antimony are deposited simultaneously at a substrate temperature of about 750° C. and an n-$Si_{0.7}Ge_{0.3}$ buffer layer 12 containing antimony of about $1\times10^{19}$ atoms per cm³ is grown to a thickness of 400 nm. On this $Si_{0.7}Ge_{0.3}$ buffer layer 12, an $Si_{0.7}Ge_{0.3}$ layer 13 to which no dopant is added intentionally is grown to a thickness of 100 nm at a substrate temperature of 650° C. The thickness of a film which can grow without dislocations of this Ge composition being extended into the film, that is, the critical film thickness is at most 100 nm. Therefore, many misfit dislocations are introduced in the interface between the Si substrate and n-$Si_{0.7}Ge_{0.3}$ layer. On this layer 13, an $Si_{0.9}Ge_{0.1}$ layer 14 to which no dopant is added intentionally is grown to a thickness of 5 nm and an $Si_{0.7}Ge_{0.3}$ layer 15 is grown to a thickness of 5 nm at a substrate temperature of 650° C. Furthermore, on the layer 15, an $Si_{0.9}Ge_{0.1}$ layer 16 is grown to a thickness of 5 nm, and an $Si_{0.7}Ge_{0.3}$ layer 17 is grown to a thickness of 5 nm on the layer 16, and an $Si_{0.9}Ge_{0.1}$ layer 18 is grown to a thickness of 10 nm, and a p-$Si_{0.9}Ge_{0.1}$ layer 19 containing boron of about $1\times10^{19}$ atoms per cm³ is grown to a thickness of 40 nm by depositing boron of p type dopant, Si, and Ge simultaneously (FIG. 4a). The structure shown in FIG. 4a is shaped as shown in FIG. 4b using the photolithography method, and SiO$_2$ 20 is deposited on it to a thickness of 100 nm at 400° C. by the thermal CVD method. The structure shown in FIG. 4b is shaped as shown in FIG. 4c using the photolithography method, and aluminum electrodes 21 and 22 for current injection are deposited. A diode is produced as shown in FIG. 4d using the photolithography method. In this structure, when a voltage of about 2 V is applied between the electrodes 21 and 22, strong light of about 0.9 eV emitted by transition with light emission without phonon is observed at room temperature.

Si(100) shown above indicates an Si layer having a crystal orientation in which the (100) plane is the main surface.

It is desirable that the carrier density of each of an n type and p type semiconductor layer is high because the resistance is low. A carrier density ranging from $10^{18}$ to $10^{20}$ atoms per cm$^3$ is practical. In this embodiment and the subsequent embodiments, a carrier density of $10^{19}$ atoms per cm$^3$ is used.

Embodiment 2

Figure 5A:
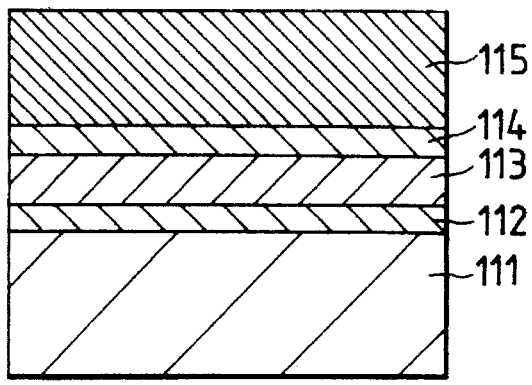
FIGS. 5a, 5b, 5c, 5d, and 5e are schematic cross sectional views showing the manufacturing process of the second semiconductor optical device of the present invention in another embodiment of the present invention.

As shown in FIG. 5a, the surface of an n-Si(100) substrate 111 is cleaned, and an undoped single crystalline Si layer 112 with a thickness of 5 nm, a single crystalline $Si_{0.8}Ge_{0.2}$ layer 113 with a thickness of 10 nm, and an undoped single crystalline Si layer 114 with a thickness of 5 nm are grown at 650° C. using the MBE (molecular beam epitaxy) method. The sample with the structure shown in FIG. 5a is taken from the molecular beam epitaxy apparatus. A p type hydrogenated amorphous Si layer 115 with a thickness of 100 nm is grown by the plasma CVD (chemical vapor deposition) method. Hydrogenated amorphous Si has wider band gap than Si, and an effect which is the same as that of $Si_{1-B}C_B$ can be expected.

Figure 5D:
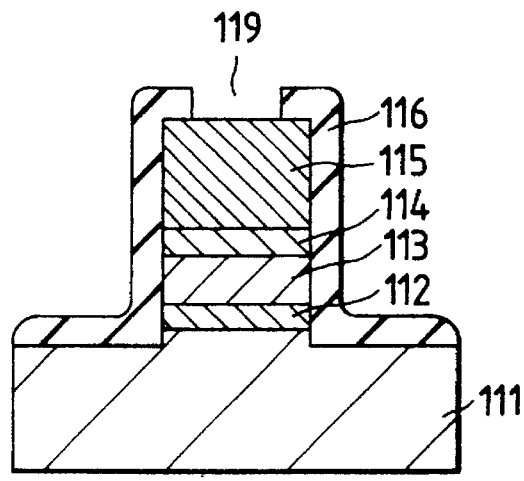
Figure 5B:
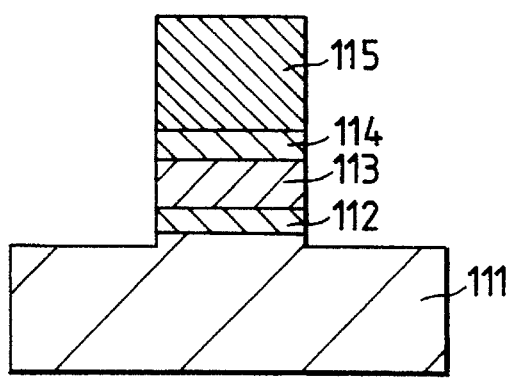
Figure 5E:
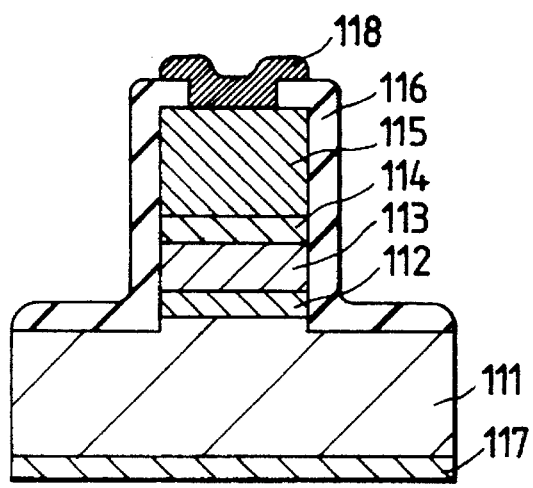
Figure 5C:
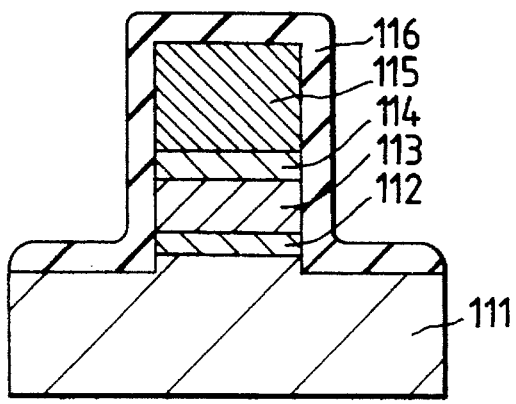

Thereafter, the structure shown in FIG. 5a is etched to a size of 4 μm (width) by 400 μm (length) by the dry etching method as shown in FIG. 5b. A SiO$_2$ layer 116 with a thickness of 100 nm is deposited on it at 400° C. by the CVD method as shown in FIG. 5c. A hole is made in the SiO$_2$ layer 116 by the photolithography method as shown in FIG. 5d. Al is deposited and patterned as shown in FIG. 5d so as to form electrodes 117 and 118 (FIG. 5e). A light emitting device of about 1 eV which emits light at room temperature is produced.

Even when three layers of the layered structure consisting of the undoped single crystalline Si layer 112 and single crystalline $Si_{0.8}Ge_{0.2}$ layer 113 are formed in the same thickness as the above mentioned and the other layers are the same as the above mentioned, a light emitting device which emits light at room temperature is obtained. The light emitting efficiency in this case is about two times of the above mentioned.

Even if a p type hydrogenated amorphous $Si_{0.9}C_{0.1}$ layer is used in place of the p type hydrogenated amorphous Si layer 115, a light emitting device which emits light almost in the same way is obtained.

Embodiment 3

Figure 6A:
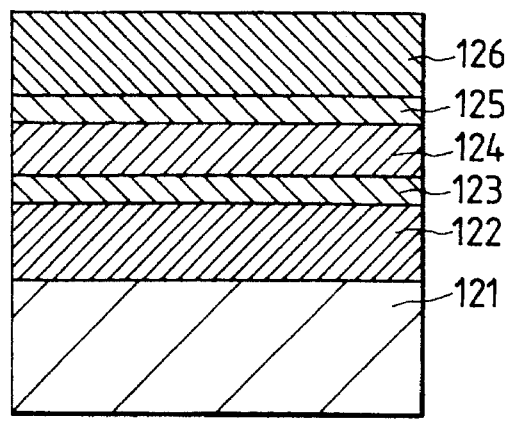
FIGS. 6a, 6b, 6c, 6d, and 6e are schematic cross sectional views showing the manufacturing process of the third semiconductor optical device of the present invention in still another embodiment of the present invention.

As shown in FIG. 6a, the surface of an n-Si(100) substrate 121 is cleaned, and an n type single crystalline $Si_{0.55}Ge_{0.40}C_{0.05}$ layer 122 with a thickness of 100 nm, an undoped single crystalline $Si_{0.55}Ge_{0.40}C_{0.05}$ layer 123 with a thickness of 5 nm, a single crystalline $Si_{0.8}Ge_{0.2}$ layer 124 with a thickness of 10 nm, an undoped single crystalline $Si_{0.55}Ge_{0.40}C_{0.05}$ layer 125 with a thickness of 5 nm, and a p type single crystalline $Si_{0.55}Ge_{0.40}C_{0.05}$ layer 126 with a thickness of 100 nm are grown at 650° C. by the MBE method.

Figure 6D:
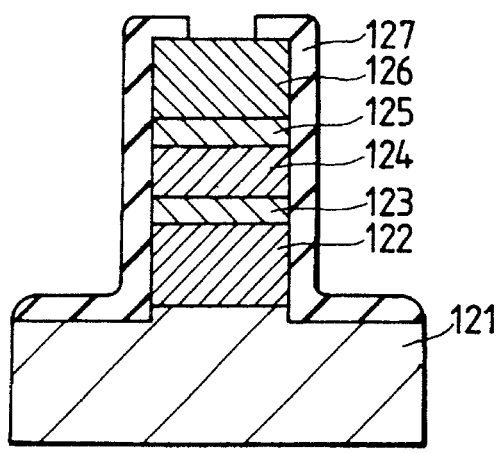
Figure 6B:
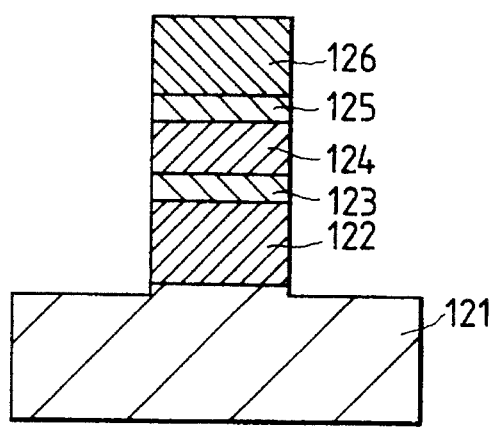
Figure 6E:
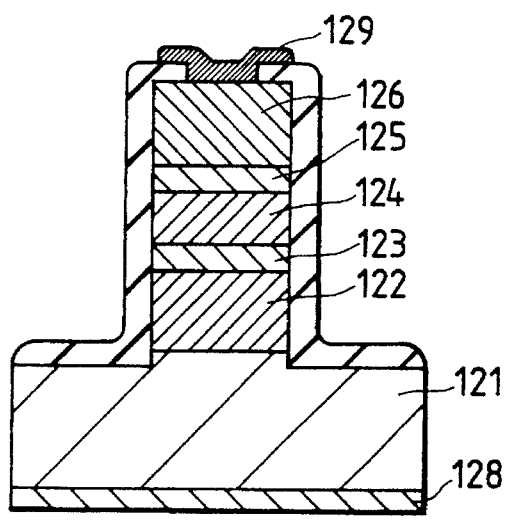
Figure 6C:
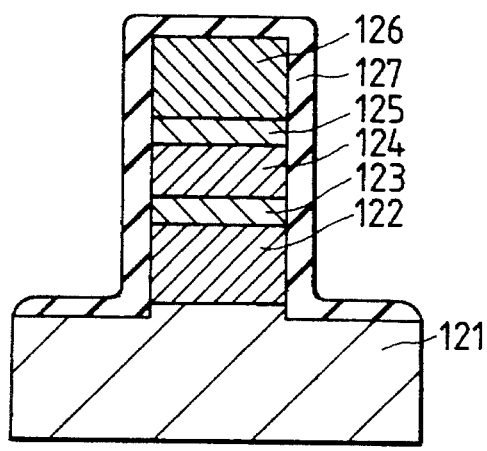

Thereafter, the structure shown in FIG. 6a is processed in the shape shown in FIG. 6b by the dry etching method in the same way as with Embodiment 2. A SiO$_2$ layer 127 with a thickness of 100 nm is deposited on it at 400° C. by the CVD method as shown in FIG. 6c. The structure shown in FIG. 6c is shaped as shown in FIG. 6d by the photolithography method. Al is deposited and patterned as shown in FIG. 6d so as to form electrodes 128 and 129 (FIG. 6e). A light emitting device of about 1 eV which emits light at room temperature is produced.

Even when three layers of the above mentioned layered structure consisting of the undoped single crystalline $Si_{0.55}Ge_{0.40}C_{0.05}$ layer 123 and single crystalline $Si_{0.8}Ge_{0.2}$ layer 124 are formed in the same thickness and the other layers are the same as the above mentioned, a light emitting device which emits light at room temperature is obtained. The light emitting efficiency in this case is about two times of the above mentioned.

Even if a p type single crystalline $Si_{0.9}C_{0.1}$ layer is used in place of the p type single crystalline $Si_{0.55}Ge_{0.40}C_{0.05}$ layer, a light emitting device which emits light almost in the same way is obtained.

Embodiment 4

Figure 7A:
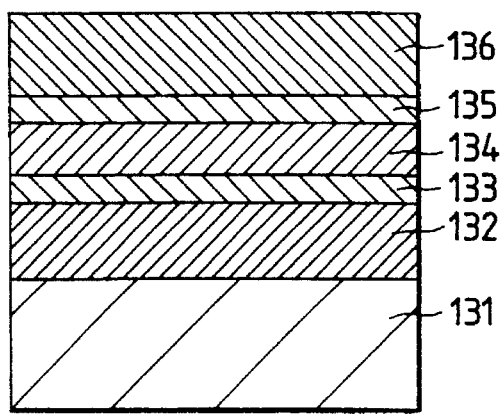
FIGS. 7a, 7b, 7c, 7d, and 7e are schematic cross sectional views showing the manufacturing process of the fourth semiconductor optical device of the present invention in a further embodiment of the present invention.

As shown in FIG. 7a, the surface of an n-Si(100) substrate 131 is cleaned, and an n type single crystalline Si layer 132 with a thickness of 100 nm, an undoped single crystalline Si layer 133 with a thickness of 5 nm, a single crystalline $Si_{0.8}Ge_{0.1}Sn_{0.1}$ layer 134 with a thickness of 10 nm, an undoped single crystalline Si layer 135 with a thickness of 5 nm, and a p type single crystalline Si layer 136 with a thickness of 100 nm are grown at 650° C. by the MBE method.

Figure 7D:
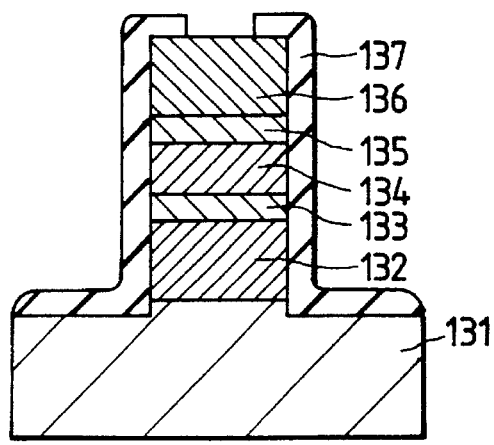
Figure 7B:
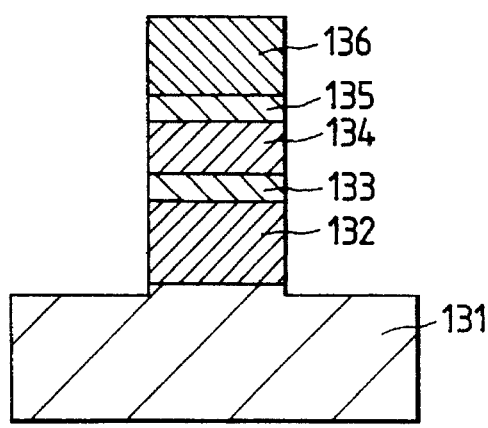
Figure 7E:
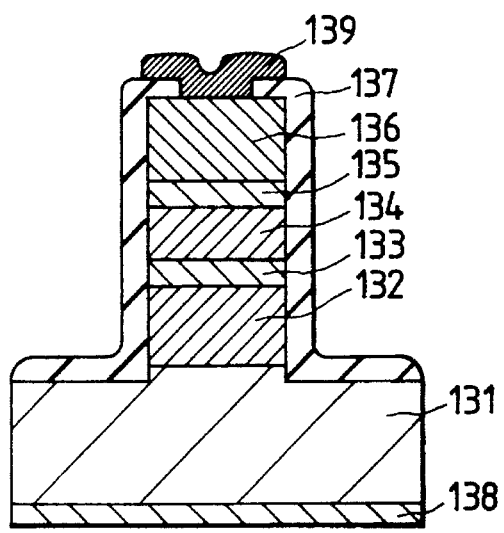
Figure 7C:
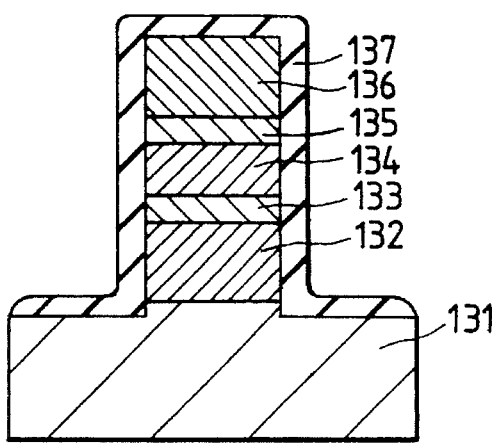

Thereafter, the structure shown in FIG. 7a is processed in the shape shown in FIG. 7b by the dry etching method in the same way as with Embodiment 2. A SiO$_2$ layer 137 with a thickness of 100 nm is deposited on it at 400° C. by the CVD method as shown in FIG. 7c. The structure shown in FIG. 7c is shaped as shown in FIG. 7d by the photolithography method. Al is deposited and patterned as shown in FIG. 7d so as to form electrodes 138 and 139 (FIG. 7e). A light emitting device of about 1 eV which emits light at room temperature is produced.

Even when three layers of the layered structure consisting of the undoped single crystalline Si layer 133 and single crystalline $Si_{0.8}Ge_{0.1}Sn_{0.1}$ layer 134 are formed in the same thickness as the above mentioned and the other layers are the same as the above mentioned, a light emitting device which emits light at room temperature is obtained. The light emitting efficiency in this case is about two times of the above mentioned.

Embodiment 5

Figure 8A:
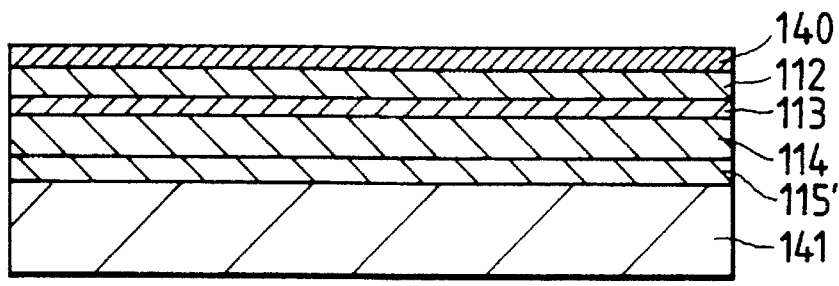
FIGS. 8a and 8b are schematic cross sectional views showing the manufacturing process of an opto-electronic integrated circuit in a still further embodiment of the present invention.

An example that electronic elements are formed on the substrate on which the light emitting device shown in Embodiment 2 is formed, and an opto-electronic integrated circuit is formed will be explained hereunder. As shown in FIG. 8a, the surface of an Si(100) substrate 141 is cleaned, and a p type single crystalline Si layer 115' with a thickness of 100 nm is formed at 650° C. by the MBE method, and then an undoped single crystalline Si layer 114 with a thickness of 5 nm, a single crystalline $Si_{0.8}Ge_{0.2}$ layer 113 with a thickness of 10 nm, and an undoped single crystalline Si layer 112 with a thickness of 5 nm are grown in the reverse order of that shown in Embodiment 2, and then an n type single crystalline Si layer 140 is formed.

Figure 8B:
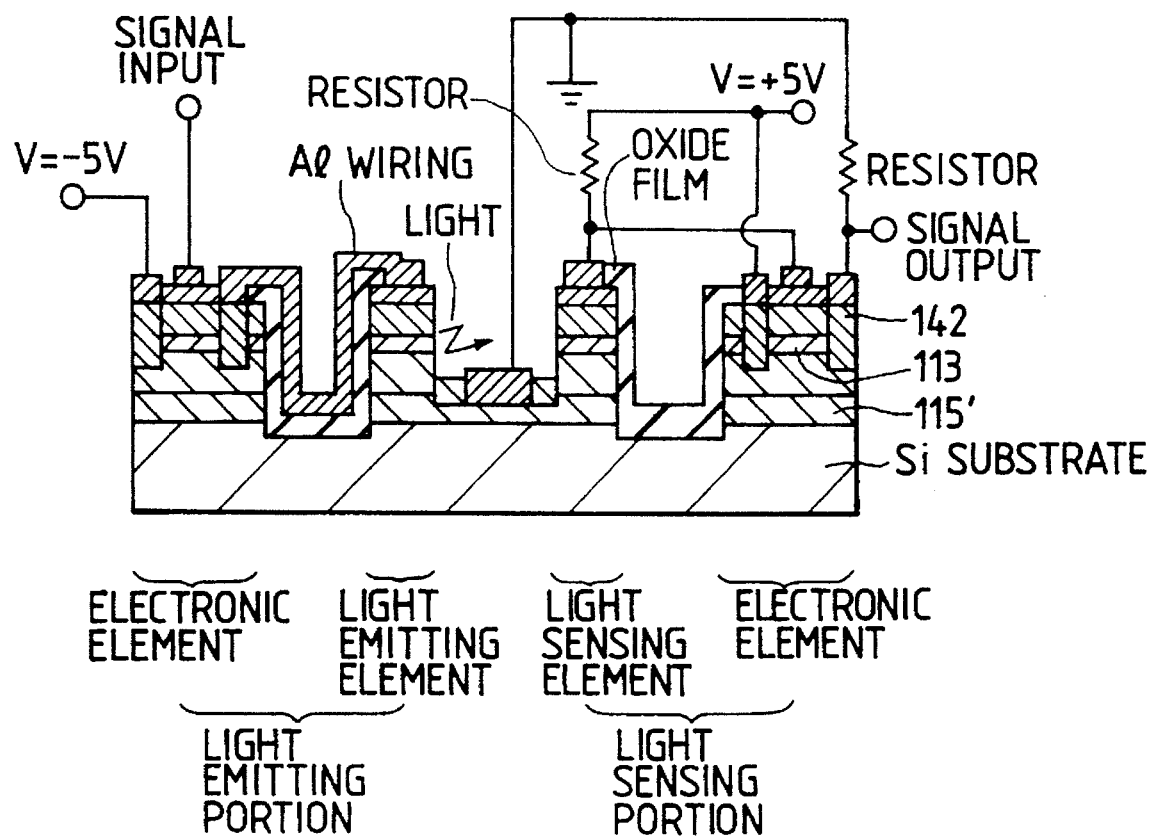

Thereafter, as shown in FIG. 8b, the light emitting device in the light emitting portion, the electronic element for transferring electric signals to it, the light sensing device in the light sensing portion, and the electronic element for receiving electric signals from it are processed in the predetermined shapes by the dry etching method. The light emitting device portion and light sensing device portion are processed in the same way as with Embodiment 2 so as to form devices, and the electronic element portion is formed as an n type region 142 by ion implantation so as to form a field effect transistor using it as a source drain, and the circuit is wired as shown in the drawing. This opto-electronic integrated circuit operates satisfactorily at room temperature.

Even when three layers of the layered structures consisting of the undoped single crystalline Si layer and single crystalline $Si_{0.8}Ge_{0.2}$ layer are formed in the same way as with Embodiment 2 and the other layers are the same as the above mentioned, an opto-electronic integrated circuit having an almost similar effect is obtained. According to the embodiment, a space is provided between the light emitting surface of the light emitting device and the light sensing surface of the light sensing device. However, an optical guide made of a transparent material such as glass may be mounted. The same may be said with the subsequent embodiments.

Embodiment 6

An example that electronic elements are formed on the substrate on which the light emitting device shown in Embodiment 3 is formed, and an opto-electronic integrated circuit is formed will be explained hereunder. The surface of an Si(100) substrate is cleaned and then the corresponding layers are formed in the reverse order of that in Embodiment 3 starting with a p type single crystalline $Si_{0.55}Ge_{0.40}C_{0.05}$ layer. Next, each element portion is processed in the predetermined shape by the dry etching method according to Embodiment 5. By doing this, the elements and circuit lines are formed.

The obtained opto-electronic integrated circuit has a structure that the light emitting device and light sensing device of the structure shown in FIG. 8b are replaced with the devices shown in Embodiment 3 (the structure shown in Embodiment 3 is made upside down) and operates satisfactorily at room temperature.

Even when three layers of the layered structure consisting of the undoped single crystalline $Si_{0.55}Ge_{0.40}C_{0.05}$ layer and single crystalline $Si_{0.8}Ge_{0.2}$ layer are formed and the other layers are the same as the above mentioned and furthermore even when a p type single crystalline $Si_{0.9}C_{0.1}$ layer is used in place of the p type single crystalline $Si_{0.55}Ge_{0.40}C_{0.05}$ layer, an opto-electronic integrated circuit which has an almost similar effect is obtained.

Embodiment 7

An example where electronic elements are formed on the substrate on which the light emitting device shown in Embodiment 4 is formed, and an opto-electronic integrated circuit is formed will be explained hereunder. The surface of an Si(100) substrate is cleaned and then the corresponding layers are formed in the reverse order of that in Embodiment 4 starting with a p type single crystalline Si layer. Next, each element portion is processed in the predetermined shape by the dry etching method according to Embodiment 5. By doing this, the elements and circuit lines are formed.

The obtained opto-electronic integrated circuit has a structure that the light emitting device and light sensing device of the structure shown in FIG. 8b are replaced with the devices shown in Embodiment 4 (the structure shown in Embodiment 4 is made upside down) and operates satisfactorily at room temperature.

Even when three layers of the layered structure consisting of the undoped single crystalline Si layer and single crystalline $Si_{0.8}Ge_{0.1}Sn_{0.1}$ layer are formed and the other layers are the same as the above mentioned and furthermore even when an undoped single crystalline $Si_{0.9}Ge_{0.1}$ layer is used in place of the undoped single crystalline Si layer, or even when three layers of a layered structure consisting of this layer and a single crystalline $Si_{0.8}Ge_{0.1}Sn_{0.1}$ layer are formed and furthermore even when an n type single crystalline $Si_{0.9}Ge_{0.1}$ layer is used in place of the n type single crystalline Si layer or even when a p type single crystalline $Si_{0.9}Ge_{0.1}$ layer is used in place of the p type single crystalline Si layer, an opto-electronic integrated circuit which has an almost similar effect is obtained.

Embodiment 8

The surface of a p-Si(100) substrate is cleaned, and then a p type $Si_{0.7}Ge_{0.3}$ buffer layer with a thickness of 400 nm is formed, and an undoped $Si_{0.7}Ge_{0.3}$ layer with a thickness of 100 nm is formed, and a layered structure consisting of an undoped $Si_{0.9}Ge_{0.1}$ layer with a thickness of 5 nm and an updoped $Si_{0.7}Ge_{0.3}$ layer with a thickness of 5 nm, an $Si_{0.9}Ge_{0.1}$ layer with a thickness of 10 nm, and an n type $Si_{0.9}Ge_{0.1}$ layer with a thickness of 40 nm are formed sequentially. Next, in the same way as with Embodiments 5 to 7, the light emitting device in the light emitting portion, the electronic element for transferring electric signals to it, the light sensing device in the light sensing portion, and the electronic element for receiving electric signals from it are processed in the predetermined shapes by the dry etching method. The light emitting device portion and light sensing device portion are processed in the same way as with Embodiment 1 so as to form devices, and the electronic element portion is formed as an n type region by ion implantation so as to form a field effect transistor using it as a source drain, and the circuit is wired as shown in FIG. 8b. This opto-electronic integrated circuit operates satisfactorily at room temperature. When the number of layered structures is increased, the efficiency of each of the light emitting device and light sensing device can be enhanced.

As shown by the above description, according to the present invention, since a light emitting device can be formed using IV-group semiconductors such as Si and Ge, not only LSIs but also optical devices can be formed on the same substrate. Therefore, light can be used easily in place of conventional circuit lines between LSIs.

The semiconductor optical device of the present invention operates at room temperature and a quantum efficiency of at least 1% is obtained.

What is claimed is:

1. A semiconductor optical device comprising a first conductivity type single crystalline Si substrate, a first conductivity type buffer layer of $Si_{1-x}Ge_x$ which is formed on said single crystalline Si substrate, a layered structure consisting of at least one pair of an $Si_{1-y}Ge_y$ layer and $Si_{1-z}Ge_z$ layer which are lattice-matched and formed alternately on said buffer layer, and a second conductivity type $Si_{1-Y}Ge_Y$ layer which is formed on said layered structure, wherein X, Y, and Z satisfy the conditions that $0<X<0.5$, $0<Y<0.5$, $0<Z<0.5$, $Y<X$, and $Y<Z$, and wherein said layered structure forms a light emitting region.

2. A semiconductor optical device according to claim 1, wherein the thicknesses of said $Si_{1-Y}Ge_Y$ layer and said $Si_{1-Z}Ge_Z$ layer constituting said layered structure range from 5 nm to 10 nm.

3. A semiconductor optical device according to claim 2, wherein the thickness of said buffer layer is at least the critical film thickness.

4. A semiconductor optical device according to claim 1, wherein said layered structure comprises a plurality of pairs of $Si_{1-Y}Ge_Y$ layers and said $Si_{1-Z}Ge_Z$ layers.

5. A semiconductor optical device comprising a first conductivity type single crystalline Si substrate, a layered structure consisting of at least one pair of an undoped single crystalline Si layer and single crystalline $Si_{1-A}Ge_A$ mixed crystal layer ($0<A<1$) which are lattice-matched and formed alternately on said single crystalline Si layer, a second undoped single crystalline Si layer which is mounted on said layered structure, and a second conductivity type $Si_{1-B}C_B$ layer ($0 \leq B<1$) which is mounted on said second undoped single crystalline Si layer, wherein said $Si_{1-B}C_B$ layer has a wider band gap than said second undoped single crystalline Si layer to form a potential barrier and, said single crystalline $Si_{1-A}Ge_A$ mixed crystal is a light emitting region.

6. A semiconductor optical device according to claim 5, wherein said first conductivity type single crystalline Si substrate is an n type single crystalline Si substrate and constitutes an electron injection electrode, and said second conductivity type $Si_{1-B}C_B$ layer is a p type hydrogenated amorphous $Si_{1-B}C_B$ layer and constitutes a hole injection electrode.

7. A semiconductor optical device according to claim 5, wherein the thicknesses of said $Si_{1-A}Ge_A$ mixed crystal layer and Si layer constituting said layered structure range from 2 nm to 20 nm and 2 nm to 10 nm respectively.

8. A semiconductor optical device according to claim 5, wherein said layered structure comprises a plurality of pairs of undoped single crystalline Si layers and single crystalline $Si_{1-A}Ge_A$ mixed crystal layers.

9. A semiconductor optical device comprising a first conductivity type single crystalline $Si_{1-C-D}Ge_CC_D$ mixed crystal layer ($0<C<1$, $0<D<1$), a layered structure consisting of at least one pair of an undoped single crystalline $Si_{1-E-F}Ge_EC_F$ mixed crystal layer ($0<E<1$, $0<F<1$) and a single crystalline $Si_{1-G}Ge_G$ mixed crystal layer ($0<G<1$) which are lattice-matched and formed alternately on said single crystalline $Si_{1-C-D}Ge_CC_D$ mixed crystal layer, a second undoped single crystalline $Si_{1-E-F}Ge_EC_F$ mixed crystal layer which is mounted on said layered structure, and a second conductivity type single crystalline $Si_{1-H-I}Ge_HC_I$ mixed crystal layer ($0 \leq H<1$, $0<I<1$) which is mounted on said second undoped single crystalline $Si_{1-E-F}Ge_EC_F$ mixed crystal layer, wherein said single crystalline $Si_{1-G}Ge_G$ mixed crystal layer is a light emitting region.

10. A semiconductor optical device according to claim 9, wherein said first conductivity type single crystalline $Si_{1-C-D}Ge_CC_D$ mixed crystal layer is an n type single crystalline $Si_{1-C-D}Ge_CC_D$ mixed crystal layer and constitutes an electron injection electrode and said second conductivity type single crystalline $Si_{1-H-I}Ge_HC_I$ mixed crystal layer is a p type single crystalline $Si_{1-H-I}Ge_HC_I$ mixed crystal layer and constitutes a hole injection electrode.

11. A semiconductor optical device according to claim 9, wherein the thicknesses of said $Si_{1-E-F}Ge_EC_F$ mixed crystal layer and $Si_{1-G}Ge_G$ mixed crystal layer constituting said layered structure range from 2 nm to 10 nm and 2 nm to 20 nm respectively.

12. A semiconductor optical device according to claim 9, wherein said layered structure comprises a plurality of pairs of undoped single crystalline $Si_{1-E-F}Ge_EC_F$ mixed crystal layers and single crystalline $Si_{1-G}Ge_G$ mixed crystal layers.

13. A semiconductor optical device comprising a first conductivity type single crystalline $Si_{1-J}Ge_J$ mixed crystal layer ($0 \leq J<1$), a layered structure consisting of at least one pair of an undoped single crystalline $Si_{1-K}Ge_K$ mixed crystal layer ($0 \leq K<1$) and a single crystalline $Si_{1-L-M}Ge_LSn_M$ mixed crystal layer ($0<L<1$, $0<M<1$) which are lattice-matched and formed alternately on said single crystalline $Si_{1-J}Ge_J$ mixed crystal layer, a second undoped single crystalline $Si_{1-K}Ge_K$ mixed crystal layer which is mounted on said layered structure, and a second conductivity type single crystalline $Si_{1-N}Ge_N$ mixed crystal layer ($0<N<1$) which is mounted on said second undoped single crystalline $Si_{1-K}Ge_K$ mixed crystal layer wherein said single crystalline $Si_{1-L-M}Ge_LSn_M$ mixed crystal layer is a light emitting region.

14. A semiconductor optical device according to claim 13, wherein said first conductivity type single crystalline $Si_{1-J}Ge_J$ mixed crystal layer is an n type single crystalline $Si_{1-J}Ge_J$ mixed crystal layer and constitutes an electron injection electrode, and said second conductivity type single crystalline $Si_{1-N}Ge_N$ mixed crystal layer is a p type single crystalline $Si_{1-N}Ge_N$ mixed crystal layer and constitutes a hole injection electrode.

15. A semiconductor optical device according to claim 13, wherein the thicknesses of said $Si_{1-K}Ge_K$ mixed crystal layer and said $Si_{1-L-M}Ge_LSn_M$ mixed crystal layer constituting said layered structure range from 2 nm to 10 nm and 2 nm to 20 nm respectively.

16. A semiconductor optical device according to claim 13, wherein said layered structure comprises a plurality of pairs of undoped single crystalline $Si_{1-K}Ge_K$ mixed crystal layers and single crystalline $Si_{1-L-M}Ge_LSn_M$ mixed crystal layers.

17. An opto-electronic integrated circuit comprising a semiconductor optical device as claimed in claim 1 and electronic elements formed on said Si substrate.

18. An opto-electronic integrated circuit comprising a semiconductor optical device as claimed in claim 5 and electronic elements formed on said Si substrate.

19. An opto-electronic integrated circuit comprising a semiconductor optical device as claimed in claim 9, said device being mounted on a semiconductor substrate, and electronic elements formed on the semiconductor substrate on which said semiconductor optical device is mounted.

20. An opto-electronic integrated circuit comprising a semiconductor optical device as claimed in claim 13, said device being mounted on a semiconductor substrate, and electronic elements formed on the semiconductor substrate on which said semiconductor optical device is mounted.

21. An opto-electronic integrated circuit comprising:
(1) a light emitting portion having a light emitting device comprising a first semiconductor optical device as claimed in claim 1 and electronic elements formed on said Si substrate; and
(2) a light sensing portion having a light sensing device comprising a second semiconductor optical device which is formed on said Si substrate and other electronic elements formed on said semiconductor substrate, wherein the light emitting surface of said light emitting device and the light sensing surface of said light sensing device are arranged so that they are opposite to each other.

22. An opto-electronic integrated circuit comprising:

(1) a light emitting portion having a light emitting device comprising a first semiconductor optical device as claimed in claim 5 and electronic elements formed on said Si substrate; and (2) a light sensing portion having a light sensing device comprising a second semiconductor optical device which is formed on said Si substrate and other electronic elements formed on said semiconductor substrate, wherein the light emitting surface of said light emitting device and the light sensing surface of said light sensing device are arranged so that they are opposite to each other.

23. An opto-electronic integrated circuit comprising:

(1) a light emitting portion having a light emitting device comprising a first semiconductor optical device as claimed in claim 9, said device being mounted on a semiconductor substrate, and electronic elements formed on the semiconductor substrate on which said light emitting device is mounted; and (2) a light sensing portion having a light sensing device comprising a second semiconductor optical device which is formed on said semiconductor substrate and other electronic elements formed on said semiconductor substrate, wherein the light emitting surface of said light emitting device and the light sensing surface of said light sensing device are arranged so that they are opposite to each other.

24. An opto-electronic integrated circuit comprising:

(1) a light emitting portion having a light emitting device comprising a first semiconductor optical device as claimed in claim 13, said device being mounted on a semiconductor substrate, and electronic elements formed on the semiconductor substrate on which said light emitting device is mounted; and (2) a light sensing portion having a light sensing device comprising a second semiconductor optical device which is formed on said semiconductor substrate and other electronic elements formed on said semiconductor substrate, wherein the light emitting surface of said light emitting device and the light sensing surface of said light sensing device are arranged so that they are opposite to each other.

\* \* \* \* \*